(12) United States Patent
Dubrovin et al.

(10) Patent No.: US 6,901,121 B1
(45) Date of Patent: May 31, 2005

(54) COMPENSATION OF DC OFFSET IMPAIRMENT IN A COMMUNICATIONS RECEIVER

(75) Inventors: Andrew Dubrovin, Tel Aviv (IL); Evgeny Yakhnich, Hadera (IL); Ehud Reshef, Qiryat Tivon (IL)

(73) Assignee: Comsys Communication & Signal Processing Ltd., Herzelia (IL)

( * ) Notice: Subject to any disclaimer, the term of this patent is extended or adjusted under 35 U.S.C. 154(b) by 793 days.

(21) Appl. No.: 09/789,437

(22) Filed: Feb. 20, 2001

(51) Int. Cl.[7] .......................... H03D 1/03; H03D 1/06; H09K 5/01; H09K 6/04; H04K 1/00; H04K 25/08

(52) U.S. Cl. ....................... 375/346; 327/307; 375/285; 455/284; 455/296

(58) Field of Search ................................ 375/224, 285, 375/319, 346, 348, 317; 327/307; 455/278.1, 284, 296, 226.1

(56) References Cited

U.S. PATENT DOCUMENTS

| 5,442,655 A | | 8/1995 | Dedic et al. ................. 375/340 |
| 5,457,704 A | | 10/1995 | Hoeher et al. ................. 371/43 |
| 6,269,131 B1 | * | 7/2001 | Gothe et al. ................. 375/346 |
| 6,504,884 B1 | * | 1/2003 | Zvonar ....................... 375/346 |
| 6,717,995 B2 | * | 4/2004 | Zvonar ....................... 375/340 |

FOREIGN PATENT DOCUMENTS

| DK | 19606102 | 8/1997 | ............ H04B/1/12 |
| WO | 98/25351 | 11/1997 | |
| WO | 01/03395 | 6/2000 | ........... H04L/25/06 |
| WO | 01/03396 | 6/2000 | ........... H04L/26/06 |

OTHER PUBLICATIONS

Han, Youngyearl, "On The Minimization of Overhead in Channel Impulse Response Measurement", IEEE Transactions on Vehicular Technology, vol. 47, No. 2, pp. 631–636, May 1998.

Khayrallah, A.S. et al., "Improved Channel Estimation With Side Information", IEEE, pp. 1049–1051, 1997.

Boss, Dieter, et al., "Impact of Blind Versus Non–Blind Channel Estimation on the BER Performance of GSM Receivers", IEEE Signal Processing Workshop on Higher–Order Statistics, pp. 62–66, Jul. 21–23, 1997.

Mehrotra, Asha, GSM System Engineering, Artech House Inc., 1997, pp. 160–245.

Haykin, Simon, Adaptive Filter Theory, Prentice Hall, 1996, pp. 483–535.

Larson, Lawrence E., RF and Microwave Circuit Design for Wireless Communications, Artech House Inc., 1996, pp. 74–77.

U.S. Appl. No. 09/754,566, entitled "Soft Decision Output Generator", filed Jan. 4, 2001.

(Continued)

*Primary Examiner*—Jean B. Corrielus
(74) *Attorney, Agent, or Firm*—Howard Zaretsky; Zaretsky & Associates PC

(57) ABSTRACT

A novel and useful apparatus for and method of DC offset compensation for use in a communications receiver. The invention is operative to calculate an estimate of the DC offset which is subsequently subtracted from each input sample to generate compensated samples. The training sequence portion of the uncompensated input samples is used to generate an estimate of the DC offset. The vector used in calculating the offset estimate is pre-calculated for several channel lengths and stored in memory. An estimate of the channel is generated which provides the channel length and the location in the input sample buffer of the first training sequence sample to be used in calculating the offset estimate. The channel length is used to determine the number of training sequence samples to be used and to select one of the previously calculated vectors.

52 Claims, 10 Drawing Sheets

OTHER PUBLICATIONS

U.S. Appl. No. 09/754,570, entitled "Apparatus for and Method of Converting Soft Symbol Information To Soft Bit Information", filed Jan. 4, 2001.

U.S. Appl. No. 09/792,018, entitled "Compensation of I/Q Gain Mismatch In a Communications Receiver", filed Feb. 20, 2001.

U.S. Appl. No. 09/616,161, filed Jul. 14, 2000, Yakhnich et al.

* cited by examiner

COMPENSATION OF DC OFFSET IMPAIRMENT IN A COMMUNICATIONS RECEIVER

REFERENCE TO RELATED APPLICATION

The subject matter of the present application is related to and may be advantageously combined with the subject matter of copending and commonly owned application U.S. patent application Ser. No. 09/616,161, to Yakhnich et al, filed Jul. 14, 2000, entitled "Method of Channel Order Selection and Channel Order Estimation in a Wireless Communication System," incorporated herein by reference in its entirety.

FIELD OF THE INVENTION

The present invention relates generally to communications systems and more particularly relates to an apparatus for and a method of compensating for linear impairments including DC offset in a communications system.

BACKGROUND OF THE INVENTION

In recent years, the world has witnessed explosive growth in the demand for wireless communications and it is predicted that this demand will increase in the future. In the case of cellular services, for example, there are already over 500 million users that subscribe to cellular telephone services and this number is continually increasing. Eventually, in the not too distant futures the number of cellular subscribers will exceed the number of fixed line telephone installations. In many cases, the revenues from mobile services already exceeds that for fixed line services even though the amount of traffic generated through mobile phones is much less than in fixed networks.

Other related wireless technologies have experienced growth similar to that of cellular. For example, cordless telephony, two way radio trunking systems, paging (one way and two way), messaging, wireless local area networks (WLANs) and wireless local loops (WLLs). In addition, new broadband communication schemes are rapidly being deployed to provide users with increased bandwidth and faster access to the Internet. Broadband services such as xDSL, short range high speed wireless connections, high rate satellite downlink (and the uplink in some cases) are being offered to users in more and more locations.

In connection with cellular services, the majority of users currently subscribe to digital cellular networks. Almost all new cellular handsets sold to customers are based on digital technology, typically second generation digital technology. Currently, third generation digital networks are being designed and tested which will be able to support data packet networks and much higher data rates. The first generation analog systems comprise the well known protocols AMPS, TACS, etc. The digital systems comprise GSM, TDMA (IS-136) or CDMA (IS-95), for example.

The recent explosion in demand for portable wireless communication devices has prompted a large amount of research in the design of efficient radio frequency (RF) receivers. The requirement of receiver portability, however, limits the available battery power and consequently places severe constraints on the power consumption, physical size and weight of such devices. Therefore, miniature radio receivers that dissipate low power are highly desirable. The search for efficient RF receivers has focused on the development of simplified radio receiver architectures.

For decades, nearly all RF receivers have been based on the well known superheterodyne architecture. In a superheterodyning receiver, an antenna feeds the received RF signal to an RF amplifier. The amplified RF signal is then converted to an intermediate frequency (IF) by mixing it with a signal produced by an offset local oscillator. The resulting IF signal is then amplified by an IF amplifier and then shifted to baseband by mixing it with a signal from a second local oscillator. The baseband signal is then quantized in an analog-to-digital (A/D) converter and demodulated by a digital signal processing (DSP) based demodulator. Alternatively, the radio may use conventional hardware techniques to demodulate the baseband signal and extract the original information signal.

There are several disadvantages of the superheterodyne architecture, however, which make it impractical for low-power implementation. One disadvantage is that in order for an IF amplifier to produce sufficient gain in the IF signal, IF filters biased at large currents may be needed which consume substantial power. Furthermore, these IF filters require numerous passive components which cannot be integrated onto a single chip with the rest of the receiver, adding to the size and cost of the receiver. Another significant drawback of the superheterodyne architecture results from the symmetry in mixing the RF signal with the signal from the offset local oscillator. The mixing generates not only the desired RF signal but also undesired image signals at an intermediate frequency above or below the offset local oscillator frequency. Removing the image signals, however, requires a very selective analog RF filter which complicates the design of the receiver and increases its cost.

The direct conversion receiver architecture avoids many of the above difficulties of the superheterodyne architecture. A block diagram illustrating the typical structure of a direct conversion receiver front end circuit is shown in FIG. 1. The receiver, generally referenced 10, comprises an antenna 12 coupled to an analog front end circuit 14 and a DSP based baseband signal processor 16.

The antenna 12 couples the received RF signal to an RF amplifier 18. The amplified RF signal is then converted directly to baseband (hence the term 'direct conversion') by mixing it with a signal produced by a local oscillator 22. Both I and Q baseband signals are generated via I and Q mixers 20, 26, respectively. The LO signal without any phase shift is input to the I mixer 20 while the LO signal phase is shifted 90 degrees via phase shifter 24 and is input to the Q mixer 26. The resulting baseband signals are then filtered by low pass filters 28, 32. The filtered analog I and Q signals are then converted to digital by A/D converters 30, 34. The digital I and Q signals are then processed digitally by the baseband processor 16 which demodulates the received signal using a DSP based demodulator.

Note that because the down-converted signal in the direct conversion design is centered at frequency zero, there is no image signal to be rejected making the filtering task relatively easy and thus permitting the use of active low pass filters. In addition, the direct conversion architecture relaxes the selectivity requirements of RF filters and eliminates all IF analog components previously required, allowing for a highly integrated, low-cost and low-power receiver. Due to these and other potential advantages, many vendors have been focusing efforts to designing direct conversion radio receivers.

Several well-known problems associated with direct conversion designs, however, include 1/f noise, multiplicative impairments and additive impairments (also referred to as DC-offset). These noise sources result in severe performance degradation of the receiver and reduce the detectability of the transmitted signal.

The 1/f noise (also known as flicker noise or pink noise) is an intrinsic noise phenomenon found in semiconductor devices, with a power spectral density inversely proportional to frequency. The coupling of 1/f noise with the received signal takes place primarily after down-conversion at the baseband amplifier. Since the baseband signal could be in the range of hundreds of microvolts RMS, the 1/f noise can potentially comprise a substantial fraction of the signal power, resulting in large signal distortion.

Note that in a superheterodyne architecture the IF signal is substantially amplified by an IF amplifier. Since the IF frequency is high enough that 1/f noise is negligible, the 1/f noise then becomes relatively insignificant when the IF signal is mixed down to baseband.

The DC-offset impairment is an offset voltage that appears in the signal spectrum at DC when an RF signal is converted directly to baseband. This offset value typically may dominate the desired signal and can substantially degrade the signal to noise ratio (SNR) if it is not removed.

The DC offset is derived from three main sources: transistor mismatch in the signal path, the LO signal leaking back to the antenna due to poor reverse isolation through the mixer and RF amplifier and then reflecting off the antenna and self-downconverting to DC via the mixer, a large near channel interferer leaking into the LO port of the mixer and self-downconverting to DC, 1/f noise from any operational amplifiers in the circuit and bias in the filters and amplifiers.

The first source is transistor mismatch in the signal path between the mixer and the I and Q inputs of the detector. With careful circuit design this effect could be largely minimized. The second cause of DC-offset occurs when the signal from the local oscillator, which is at the same frequency as the RF signal, leaks from the antenna and reflects off an external object and self-converts to DC. This local oscillator radiation also interferes with other nearby receivers tuned to the same frequency. Since this radiation may be one or more orders of magnitude stronger than the RF signal, this self-rectification and nearby interference introduce tremendous DC-offset after direct-conversion. Furthermore, the amount of DC-offset generated by the local oscillator radiation is difficult to predict since its magnitude changes with receiver location and orientation. Good circuit isolation techniques could reduce this effect to a certain extent, but it cannot be eliminated entirely.

The DC offset problem is particularly acute in GSM systems. GSM uses Gaussian minimum shift keying (GMSK) modulation which has a peak at DC. The offsets generated, directly add to the spectral peak of the donwconverted signal. Generally, these offsets are much larger than the RMS front-end noise, severely degrading the SNR of the receiver. One way of removing the offsets is to use AC coupling. This, however, would require impractically large capacitors in order not to remove the signal bearing spectrum around DC.

In one approach to eliminating the DC offset, an analog DC notch filter implemented as simple capacitive coupling can be used to remove most of the DC offset. This approach, however, can only be used when the information bearing signal is not at or near DC as is the case, for example, of simple two-tone signaling, i.e. FSK modulation whose spectrum comprises little energy at DC.

When a portion of the information signal is, however, at or near DC, this approach cannot be used. Many of the modulation schemes used in personal communications require low frequency information to achieve low bit error rates. Thus, simple two-tone signaling is not suitable for most RF communications applications since these applications require modulation schemes that are more spectrally efficient than FSK. In these other modulation schemes, the method of capacitively coupling the baseband signal before sampling fails because of the large signal-bearing spectrum near DC, and a notch filter at DC will remove significant portions of the signal.

Multiplicative impairments manifest as distortion of the I and Q phasor results when the components of the I and Q channels are either uniformly distorted or differentially distorted. To avoid this type of distortion requires that all the components in the I and Q channel paths have constant gain and phase characteristics across their dynamic range. To assure such constant gain and phase characteristics is difficult and costly.

Another source of multiplicative type noise is the sampling jitter of the sample and hold used at the input to the A/D converters which introduces differential phase distortion between the I and Q channels.

A block diagram illustrating the impairment model of the channel and the receiver front end circuit is shown in FIG. 2. The channel is modeled as a dispersive, fading channel 42. The phase/frequency offset manifests as multiplicative noise 44. The I/Q mismatch 46 results from nonsymmetrical low pass filtering. The impairment is modeled as multiplying 54 the imaginary signal Q by an attenuation mismatch g while the real signal is considered the unimpaired reference. The real and impaired imaginary signals are added via adder 58. The DC offset additive impairment is then added to the signal via adder 60.

A diagram illustrating the effects of the noise impairments including attenuation mismatch and DC offset on an 8-PSK constellation is shown in FIG. 3. The effects of the multiplicative and additive impairments are illustrated with respect to an 8-PSK signal. The ideal unimpaired 8-PSK constellation 70 is a circle centered at the origin in the I/Q plane. The multiplicative impairments (i.e. attenuation mismatch by the LPFs, sampling jitter, etc.) impart an elliptical shape to the constellation. DC offset impairments further impart a linear shift to the constellation making the center of the constellation a point other than the origin.

It is therefore desirable to have a mechanism for compensating for the DC offset impairments in a communications receiver that is efficient, relatively easy to implement either in hardware, software or a combination of the two and which is not costly to implement. The DC offset correction mechanism should also permit the use of protocols and modulation schemes that have significant portions of spectrum around or near DC such as GMSK and 8-PSK used in EDGE systems.

SUMMARY OF THE INVENTION

The present invention is a novel and useful apparatus for and method of DC offset compensation for use in a communications receiver. The invention can be used to compensate for DC offset impairments generated in the hardware front end portion of communications receivers. Such impairments may be caused, for example, by self-downconversion of the local oscillator signal leaking through the mixer and reflecting off the antenna or by noise introduced by the analog to digital converters.

The invention can be used in a variety of applications including, but not limited to, communication receivers whose baseband processing is implemented in hardware, software or a combination of hardware and software. The present invention is useful in compensating for the DC offset impairment generated in the hardware front end portion of direct conversion receivers. The offset impairments must be corrected in order to achieve adequate performance, especially in the case of EDGE system signal which uses GMSK and 8-PSK modulations.

The invention is operative to calculate an estimate of the DC offset which is then subtracted from each input sample to generate compensated samples. Rather than attempt to pinpoint the actual source of any particular linear impairment (e.g., DC offset), the invention works backwards to compensate for any and all linear impairments. Once the additive impairments are compensated for, the impairments caused by gain mismatch are then corrected. It is noted that compensating in the reverse order, i.e. first gain mismatch and then DC offset, yields incorrect results.

The training sequence portion of the uncompensated input samples is used to generate the DC offset estimate. In accordance with the present invention, the vector used in calculating the offset estimate is pre-calculated for several channel lengths and stored in memory. An estimate of the channel is generated which provides the channel length and the location in the input sample buffer of the first training sequence sample to be used in calculating the offset estimate. The channel length is used to determine the number of training sequence samples to be used and to select one of the previously calculated vectors.

In addition to the technique of DC offset detection and compensation, the invention specifies the order of compensation of linear and nonlinear impairments. The detection and compensation of linear impairments (i.e. DC offset) is performed before the detection and compensation of nonlinear impairments, in accordance with the model presented for linear and nonlinear effects on the received signal.

In accordance with the present invention, the convolution matrix H is used in the compensation of the DC offset. The H matrix can be pre-calculated for several channel lengths and stored in memory or, alternatively, it can be built on the fly for any desired channel length. In either case, a plurality of matrices can be pre-calculated or built depending on the application.

Throughout this document, references to pre-calculating one or more convolution H matrices are intended to encompass not only the pre-calculation of the convolution H matrix but also the rebuilding on the fly of one or more convolution H matrices from scratch for each channel length L. Note that the size of the convolution H matrix varies depending on the channel length and the number of training symbols transmitted. The scope of the invention is not limited by the technique used to obtain the H matrix.

For example, in the case of EDGE, the dimensions of the H matrix varies from 3×24 (channel length L=3) to 7×20 (L=7). Since the H matrix is complex, sufficient memory, e.g., ROM, etc., must be allocated to store both real and imaginary parts. Moreover, since the EDGE standard specifies 8 different training sequences, the amount of required memory must be multiplied by a factor of 8.

The method of the invention can be performed in either hardware or software. A DC offset compensation module is presented which is operative to pre-compute a plurality of vectors, one of which is subsequently selected for each message in accordance with the channel length. The offset estimate is calculated based on the received training sequence samples and subsequently subtracted from the uncompensated input samples to yield compensated output samples.

The DC offset compensation can be implemented in either hardware, software or a combination of both. In the case of software implementation, a computer comprising a processor, memory, etc. is disclosed which is operative to execute software adapted to perform the DC offset compensation method of the present invention.

There is therefore provided in accordance with the present invention a method of compensating for DC offset impairment in a sequence of input samples received over a channel, the method comprising the steps of calculating an DC offset impairment estimate $k = \underline{p} \cdot \underline{u}$ wherein $$\underline{p} = \frac{1^H A^H A}{1^H A^H A 1},$$

vector u represents uncompensated training sequence input samples and vector $A = I - H \cdot LS$ and subtracting the DC offset impairment estimate from each input sample so as to generate a sequence of compensated input samples.

There is also provided in accordance with the present invention a method of compensating for a DC offset in a sequence of input samples received over a channel, the method comprising the steps of calculating an estimate of the channel and determining a channel length therefrom, pre-calculating a vector $$\underline{p} = \frac{1^H A^H A}{1^H A^H A 1},$$

wherein matrix $A = I - H \cdot LS$, selecting a number of uncompensated training sequence input samples u in accordance with the channel length, calculating an estimate of the DC offset $k = \underline{p} \cdot \underline{u}$, wherein vector u represents the uncompensated training sequence input samples and subtracting the DC offset estimate from each input sample so as to generate a sequence of compensated input samples.

There is further provided in accordance with the present invention an apparatus for compensating for the DC offset in a sequence of input samples received over a channel comprising a channel estimation module adapted to generate an estimate of the channel including a channel length and the location of the first relevant training sequence input sample in an input sample buffer, means for selecting a number of uncompensated training sequence input samples making up a vector u in accordance with the channel length and the location, means for pre-calculating a vector $$\underline{p} = \frac{1^H A^H A}{1^H A^H A 1},$$

wherein matrix $A = I - H \cdot LS$, means for calculating an estimate of the DC offset $k = \underline{p} \cdot \underline{u}$ and a subtractor for subtracting the DC offset estimate from each input sample so as to generate a sequence of compensated input samples.

There is also provided in accordance with the present invention a communications receiver for receiving and decoding an M-ary transmitted signal received over a channel comprising a radio frequency (RF) front end circuit for receiving and converting the M-ary transmitted signal to a plurality of baseband input samples, a DC offset compensation module comprising processing means programmed to calculate a DC offset estimate $k = \underline{p} \cdot \underline{u}$ where $$\underline{p} = \frac{\underline{1}^H A^H A}{\underline{1}^H A^H A \underline{1}},$$

vector or u represents uncompensated training sequence input samples and matrix A=I−H·LS, subtracting the DC offset estimate from each baseband input sample so as to generate a compensated baseband input samples, a demodulator adapted to receive the compensated baseband input samples and to generate a received signal therefrom in accordance with the M-ary modulation scheme used to generate the transmitted signal, a first decoder operative to receive the received signal and to generate a sequence of soft symbol decisions therefrom, a second decoder adapted to receive the soft bit values and to generate binary received data therefrom and wherein M is a positive integer.

There is still further provided in accordance with the present invention a computer readable storage medium having a computer program embodied thereon for causing a suitably programmed system to compensate for a DC offset in a sequence of input samples received over a channel by performing the following steps when such program is executed on the system: calculating an estimate of the channel and determining a channel length therefrom, pre-calculating a vector $$\underline{p} = \frac{\underline{1}^H A^H A}{\underline{1}^H A^H A \underline{1}},$$

wherein matrix A=I−H·LS, selecting a number of uncompensated training sequence input samples u in accordance with the channel length, calculating an estimate of the DC offset k=$\underline{p}\cdot\underline{u}$, wherein vector u represents the uncompensated training sequence input samples and subtracting the DC offset estimate from each input sample so as to generate a sequence of compensated input samples.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
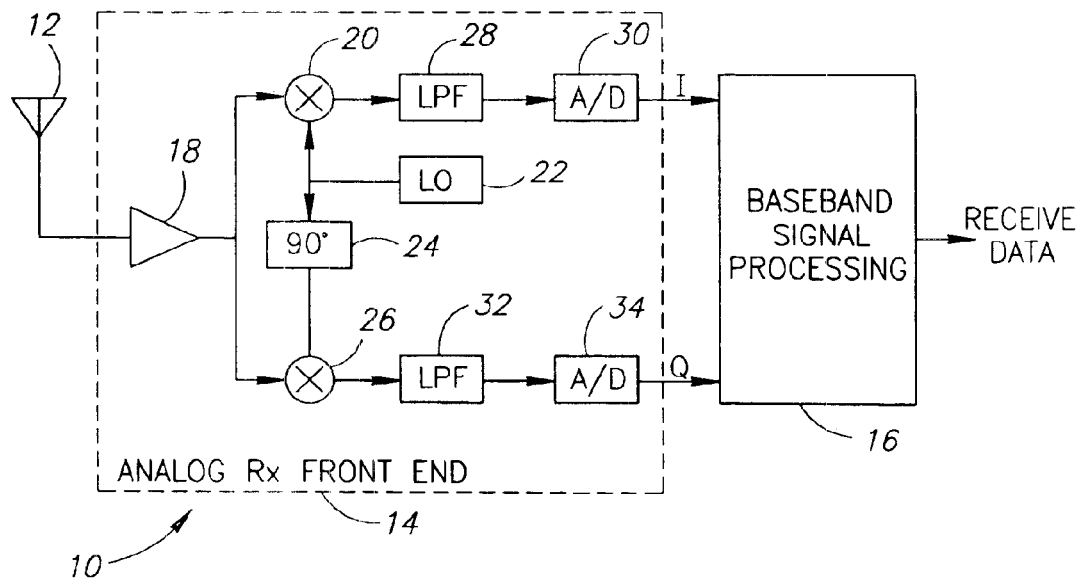
FIG. 1 is a block diagram illustrating the typical structure of a direct conversion receiver front end circuit.
Figure 2:
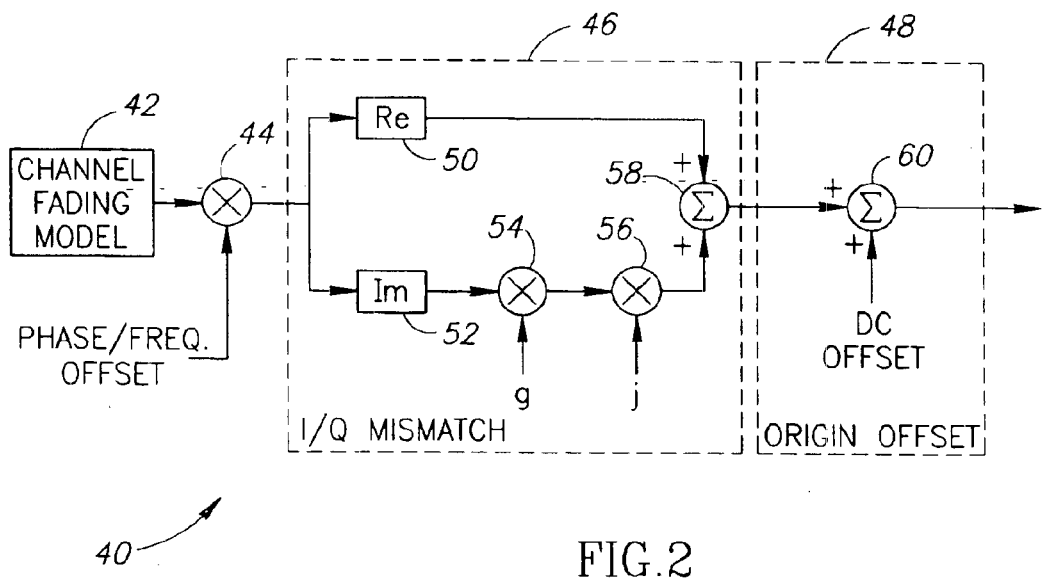
FIG. 2 is a block diagram illustrating the impairment model of the channel and the receiver front end circuit.
Figure 3:
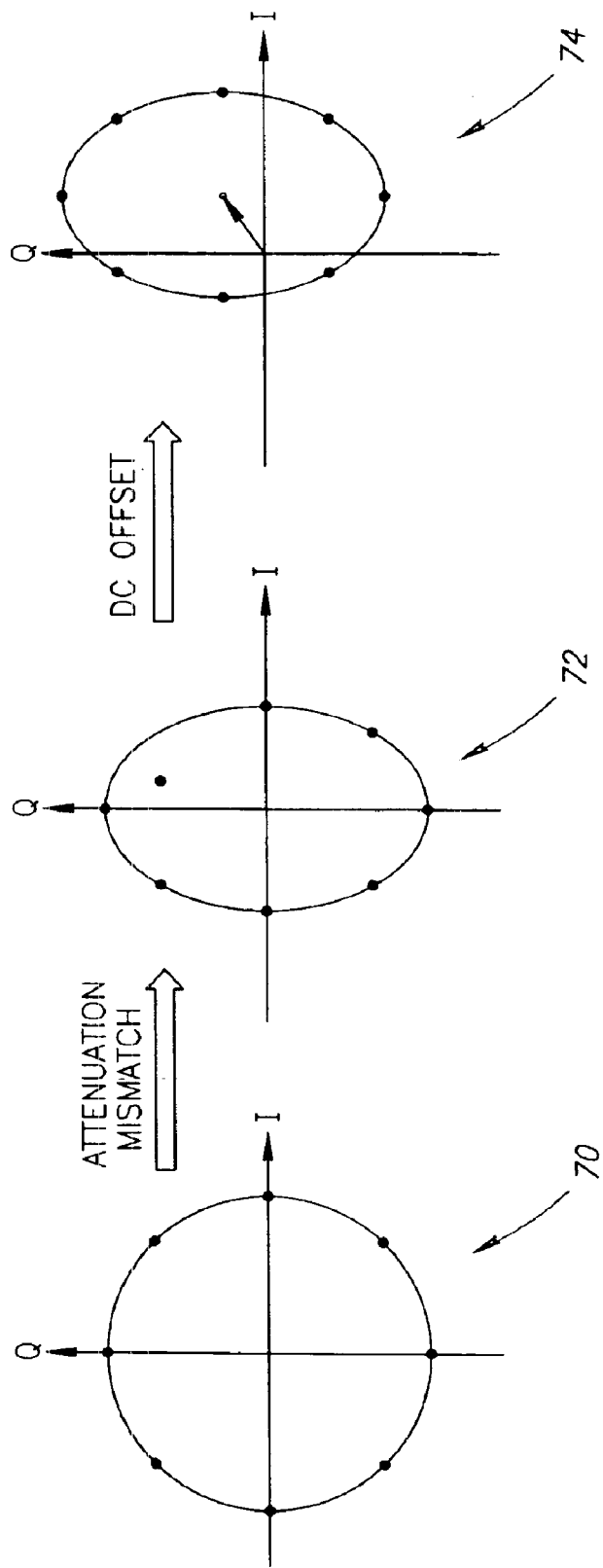
FIG. 3 is a diagram illustrating the effects of the noise impairments including attenuation mismatch and DC offset on an 8-PSK constellation.

The following notation is used throughout this document.

| Term | Definition |
| --- | --- |
| AC | Alternating Current |
| AMPS | Advanced Mobile Telephone System |
| ASIC | Application Specific Integrated Circuit |
| BER | Bit Error Rate |
| BLER | Block Error Rate |
| CDMA | Code Division Multiple Access |
| CPU | Central Processing Unit |
| CRC | Cyclic Redundancy Code |
| DC | Direct Current |
| DFE | Decision Feedback Equalizer |
| DSL | Digital Subscriber Line |
| DSP | Digital Signal Processor |
| EDGE | Enhanced Data rates for GSM and TDMA/136 Evolution |
| EEPROM | Electrically Erasable Programmable Read Only Memory |
| EEROM | Electrically Erasable Read Only Memory |
| EGPRS | Enhanced General Packet Radio System |
| EPROM | Electrically Programmable Read Only Memory |
| FEC | Forward Error Correction |
| FIR | Finite Impulse Response |
| FPGA | Field Programmable Gate Array |
| FSK | Frequency Shift Keying |
| GERAN | GSM EDGE Radio Access Network |
| GMSK | Gaussian Minimum Shift Keying |
| GSM | Global System for Mobile Communication |
| IF | Intermediate Frequency |
| ISDN | Integrated Services Digital Network |
| ISI | Intersymbol Interference |
| LO | Local Oscillator |
| LPF | Low Pass Filter |
| MAP | Maximum A Posteriori |
| MLSE | Maximum Likelihood Sequence Estimation |
| PSK | Phase Shift Keying |
| RAM | Random Access Memory |
| RF | Radio Frequency |
| RMS | Root Mean Square |
| ROM | Read Only Memory |
| SNR | Signal to Noise Ratio |
| SOVA | Soft Output Viterbi Algorithm |
| TACS | Total Access Communications Systems |
| TDMA | Time Division Multiple Access |
| VA | Viterbi Algorithm |
| WLAN | Wireless Local Area Network |
| WLL | Wireless Local Loop |

The present invention is a novel and useful apparatus for and method of DC offset compensation for use in a communications receiver. The invention can be used to compensate for DC offset impairments generated in the hardware front end portion of communications receivers. Such impairments may be caused, for example, by self-downconversion of the local oscillator signal leaking through the mixer and reflecting off the antenna or by noise introduced by the analog to digital converters.

The invention can be used in a variety of applications including, but not limited to, communication receivers whose baseband processing is implemented in hardware, software or a combination of hardware and software. The present invention is useful in compensating for the DC offset impairment generated in the hardware front end portion of direct conversion receivers. The offset impairments must be corrected in order to achieve adequate performance, especially in the case of an EDGE system signal which uses GMSK and 8-PSK modulations.

To aid in understanding the principles of the present invention, the method is described in the context of a DC offset compensation module. As described in more detail below, the DC offset compensation module is adapted to perform the following functions: calculate an estimate of the channel, pre-calculate a plurality of vectors subsequently used to generate the estimate of the DC offset, calculate the offset estimate and subtract it from each input sample.

Note that the receiver configuration presented herein is intended for illustration purposes only and is not meant to limit the scope of the present invention. It is appreciated that one skilled in the communication signal processing arts can apply the method of the invention to numerous other receiver topologies and modulation schemes as well.

Figure 4:
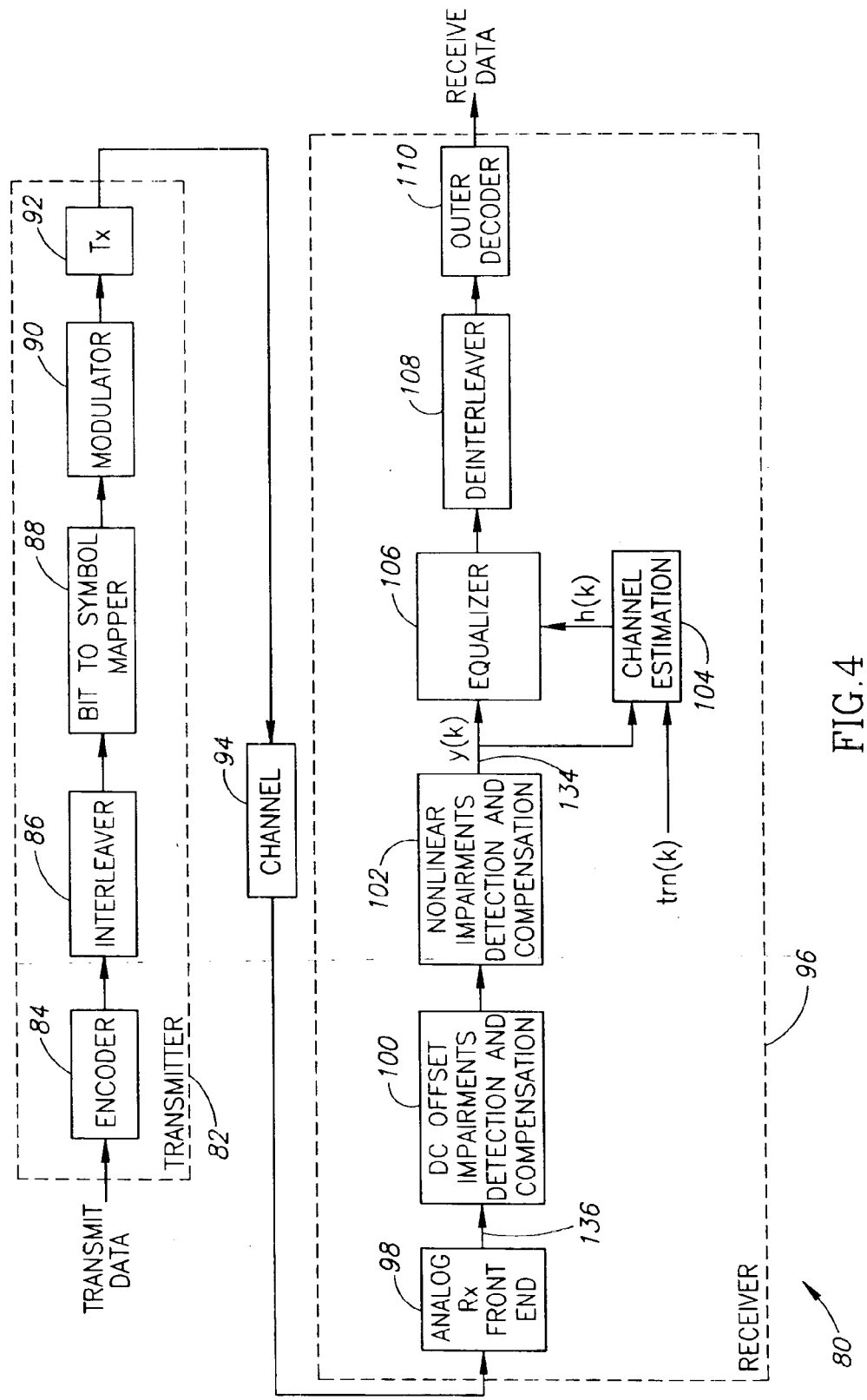
FIG. 4 is a concatenated communication system wherein the receiver employs the DC offset compensation module of the present invention to reduce linear impairments present in input samples.

A concatenated communication system wherein the receiver employs the DC offset compensation module of the present invention to reduce linear impairments (i.e. DC offset and/or other additive impairments) present in input samples is shown in FIG. 4. The communication system, generally referenced 80, comprises a concatenated encoder transmitter 82 coupled to a channel 94, and a concatenated decoder receiver 96. The transmitter comprises an encoder 84, interleaver 86, bit to symbol mapper 88, modulator 90 and transmit circuit 92.

Input data bits to be transmitted are input to the encoder which may comprise a forward error correction (FEC) encoder such as Reed Solomon, convolutional encoder, parity bit generator, etc. The encoder functions to add redundancy bits to enable errors in transmission to be located and fixed.

The bits output of the encoder are then input to the interleaver which functions to rearrange the order of the bits in order to more effectively combat error bursts in the channel. The bits output of the interleaver are then mapped to symbols by the symbol mapper. The bit to symbol mapper functions to transform bits to modulator symbols drawn from an M-ary alphabet. For example, an 8-PSK modulator converts input bits into one of eight symbols. Thus, the mapper in this case generates a symbol for every three input bits.

The symbols output from the mapper are input to the modulator which functions to receive symbols in the M-ary alphabet and to generate an analog signal therefrom. The transmit circuit filters and amplifies this signal before transmitting it over the channel. The transmit circuit comprises coupling circuitry required to optimally interface the signal to the channel medium.

The channel may comprise a mobile wireless channel, e.g., cellular, cordless, fixed wireless channel, e.g., satellite, or may comprise a wired channel, e.g., xDSL, ISDN, Ethernet, etc. It is assumed that noise is present and added to the signal in the channel. The transmitter is adapted to generate a signal that can be transmitted over the channel so as to provide robust, error free detection by the receiver.

It is noted that both the inner and outer decoders in the receiver have complimentary encoders in the system. The outer encoder in the system comprises the encoder, e.g., convolutional, etc. The inner encoder comprises the channel, which in one embodiment can be modeled as an L-symbol long FIR-type channel.

At the receiver, the analog signal from the channel is input to Rx front end circuitry 98 which demodulates and samples the received signal to generate uncompensated input samples 136. The linear impairments in the input signal which manifest as a DC offset in the input samples are removed by the DC offset detection and compensation module 100 which is operative to output DC offset compensated input samples. Nonlinear impairments in the input signal which manifest as an I/Q gain mismatch in the input samples are removed by the nonlinear impairment detection and compensation module 102 which is operative to output compensated input samples y(k) 134. The samples are then input to an inner decoder (i.e. equalizer) 106 and channel estimation block 104.

The nonlinear impairments may be removed using any technique. One technique suitable for use with the present invention is described in detail in U.S. patent application Ser. No. 09/792,018 to Yakhnich et al, filed Feb. 20, 2001, entitled "Compensation Of I/Q Gain Mismatch In A Communications Receiver," similarly assigned and incorporated herein by reference in its entirety.

The channel estimation is operative to generate a channel estimate h(k) that is used by the inner decoder equalizer. The channel estimation is generated using the compensated received input samples y(k) and the known training sequence trn(k).

Several methods of channel estimation that are known in the art and suitable for use with the present invention include, for example, a correlation method and a least squares method. The correlation method is described in detail in "GSM System Engineering," A. Mehrotra, 1997, Chapter 6 and in the article "On the Minimization of Overhead in Channel Impulse response Measurement," Y. Han, IEEE Transactions on Vehicular Technology, Vol. 47, No. 2, May 1998, pages 631–636. The least square method of channel estimation is described in more detail in the articles "Improved Channel Estimation With Side Information," A. S. Khayrallah, R. Ramesh, G. E. Bottomley, D. Koilpillai, IEEE, March 1997, pages 1049–1051 and "Impact of Blind versus Non-Blind Channel Estimation on the BER Performance of GSM Receivers," D. Boss, T. Petermann, K. Kammeyer, IEEE Signal Processing Workshop on Higher-Order Statistics, Jul. 21, 1997, pages 62–67 and in the book "Adaptive Filter Theory," S. Haykin, 1996, Chapter 11 (Method of Least Squares).

Another channel estimation technique suitable for use with the present invention is described in U.S. patent application Ser. No. 09/616,161, to Yakhnich et al, filed Jul. 14, 2000, entitled "Method of Channel Order Selection and Channel Order Estimation in a Wireless Communication System," similarly assigned and incorporated herein by reference in its entirety.

The equalizer is operative to use the channel estimate h(k) in generating the hard decisions. Note that a hard decision is one of the possible values a symbol s(k) can take. An example of an inner decoder is an equalizer which compensates for the ISI caused by the delay and time spreading of the channel. The function of the equalizer is to attempt to detect the symbols that were originally transmitted by the modulator.

Note that the equalizer is adapted to output hard symbol decisions and may comprise, for example the well known maximum likelihood sequence estimation (MLSE) based equalizer that utilizes the Viterbi Algorithm (VA), linear equalizer or decision feedback equalizer (DFE). Since the equalizer generates hard decisions only, soft decisions must subsequently be generated from the hard decisions.

Equalization is a well known technique used to combat intersymbol interference whereby the receiver attempts to compensate for the effects of the channel on the transmitted symbols. An equalizer attempts to determine the transmitted data from the received distorted symbols using an estimate of the channel that caused the distortions. In communications systems where ISI arises due to partial response modulation or a frequency selective channel, a maximum likelihood sequence estimation (MLSE) equalizer is optimal. This is the form of equalizer generally used in GSM, EDGE and GERAN systems.

The MLSE technique is a nonlinear equalization technique which is applicable when the radio channel can be modeled as a Finite Impulse Response (FIR) system. Such a FIR system requires knowledge of the channel impulse response tap values. The channel estimate is obtained using a known training symbol sequence to estimate the channel impulse response. Other equalization techniques such as DFE or linear equalization require precise knowledge of channel.

The hard decisions are input to a bitwise de-interleaver 108 which is operative to reconstruct the original order of the bits input to the transmitter. The output of the de-interleaver comprises the soft bit values in the original bit order. The de-interleaved soft bit values are subsequently input to the outer decoder 110 which generates binary receive data therefrom.

Note that if soft decisions are desired, the hard decisions output of the equalizer may be input to an optional soft output generator (not shown) which functions to generate soft bit decisions as a function of the hard decisions. A soft decision, in the ideal case, comprises the reliabilities of each possible symbol value. Soft decision information may be needed by the de-interleaver and soft decoder. Internally, the soft output computation module first computes soft symbol values which are subsequently converted to soft bit decisions.

Any suitable technique may be used to generate soft symbol information from hard decisions. One technique for generating the soft decisions is described in U.S. Pat. No. 5,457,704 to Hoeher et al., entitled "Post Processing Method and Apparatus for Symbol Reliability Generation," incorporated herein by reference in its entirety. Another suitable soft symbol generation technique is described in U.S. Pat. No. 6,731,700, entitled "Soft Decision Output Generator," incorporated herein by reference in its entirety. The technique of converting soft symbols to soft bits is described in detail in U.S. Publication No. US2002/0122510A1, entitled "Apparatus For And Method Of Converting Soft Symbol Information To Soft Bit Information," incorporated herein by reference in its entirety.

The outer decoder typically comprises a soft decision decoder, i.e. it takes soft bit values as input, which functions to detect and correct errors using the redundancy bits inserted by the encoder. The outer decoder generates the binary receive data utilizing the soft bit input. Examples of the outer decoder include convolutional decoders utilizing the Viterbi Algorithm, etc. Soft decision Viterbi decoders have the advantage of efficiently processing soft decision information and providing optimum performance in the sense of minimum sequence error probability.

Figure 5:
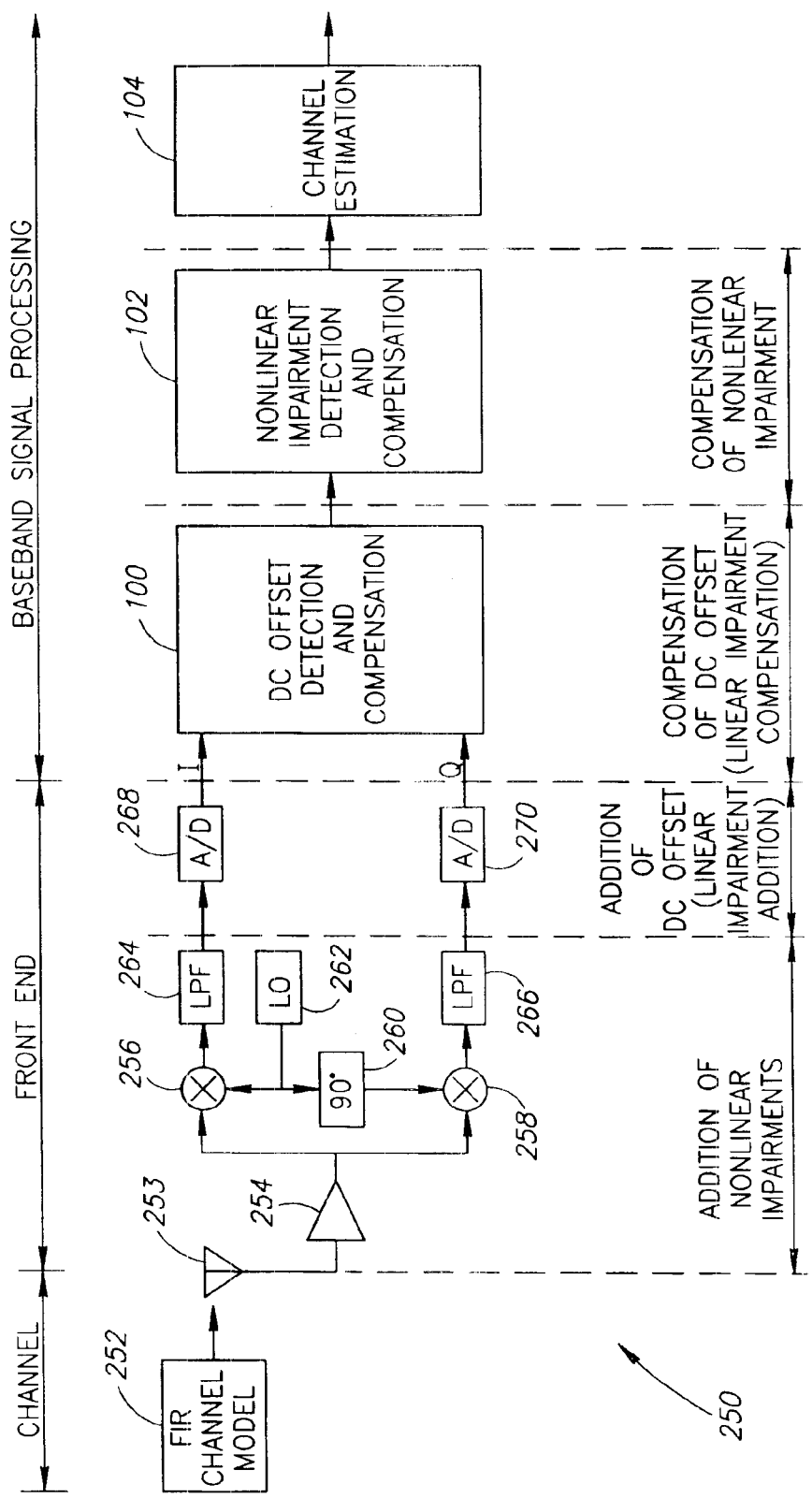
FIG. 5 is a block diagram illustrating the order to detection and compensation of DC offset and nonlinear impairments in a communications reveiver.

In addition to the technique of DC offset detection and compensation, the invention specifies a model of the hardware impairments and the order of compensation of linear and nonlinear impairments. A block diagram illustrating the order to detection and compensation of DC offset and nonlinear impairments in a communications reveiver is shown in FIG. 5.

The hardware model, generally referenced 250, is divided into three portions including channel, front end and baseband signal processing. The channel portion comprises the FIR channel model 252. The front end portion comprises the hardware components making up the front end of the receiver and the baseband signal processing comprises the signal processiong functions performed digitally in software.

In accordance with the invention, the total impairments are seperated into nonlinear and linear types of impairments. The components in the front end including the antenna 253, RF amplifier 254, I/Q mixers 256, 258, local oscillator 262 and I/Q low pass filters 264, 266, contribute the nonlinear effects such as I/Q gain mismatch. The A/D converters 268, 270 contribute linear effects including the addition of DC offset. Note that other components in the front end may also contribute linear effects. In accordance with the hardware model, however, the linear effects are considered to be added via the A/D converters.

Accurate compensation of nonlinear impairments is difficult to achieve without first compensating for linear impairments. The order of compensation also effects the channel estimation subsequently performed. Therefore, in accordance with the present invention, channel estimation and hardware impairment compensation are separated into three stages: first, detection and compensation of linear impairments 100; second, detection and compensation of nonlinear impairments 102; and third, computation of the channel estimate 104.

Figure 6:
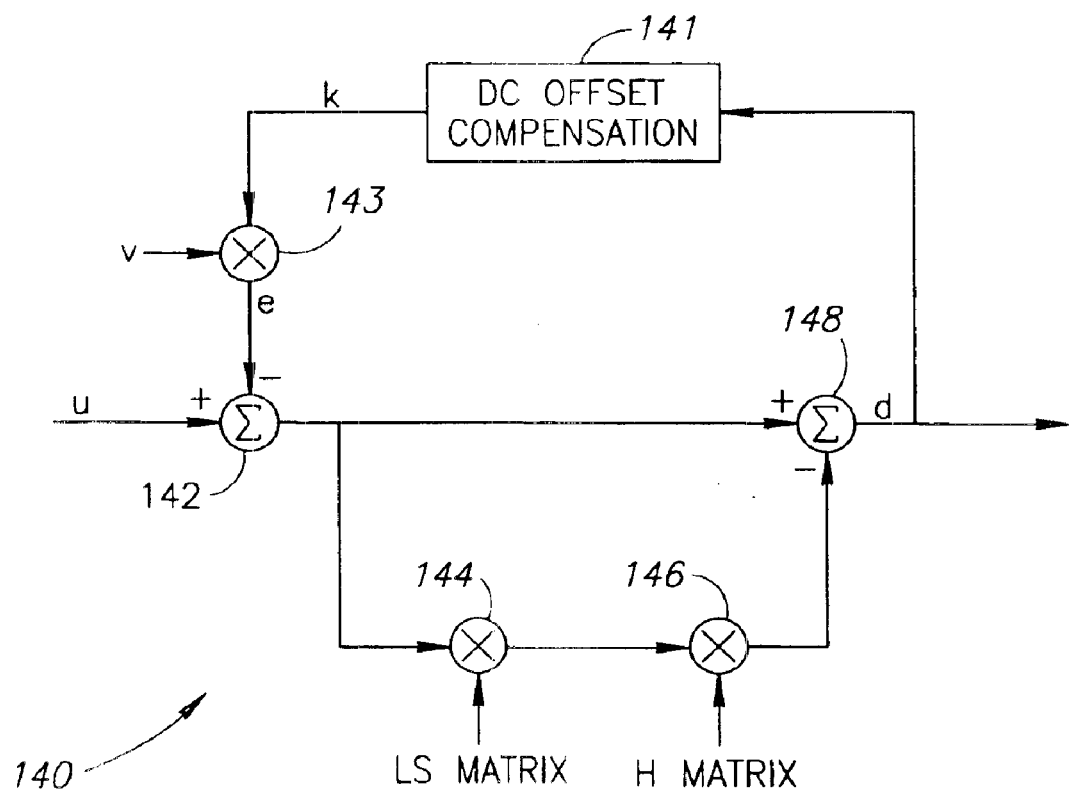
FIG. 6 is a block diagram illustrating the signal model used to derive the DC offset estimate.

The operation of the DC offset compensation module 100 will now be described in more detail. The mathematical derivation of the expressions for the estimate of the DC offset are presented hereinbelow. A block diagram illustrating the signal model used to derive the DC offset estimate is shown in FIG. 6.

The following terms defined below are used in the derivation of the expression for the DC offset estimate.

$u$ is the vector representation of the uncompensated received samples;

LS is the Least Square matrix which when multiplied with the received training sequence samples is used to derive an estimate of the channel;

H represents the convolution matrix H;

$\underline{e}$ is an error correction vector;

$\underline{v}$ is a vector of 1's;

k is the complex scalar DC offset estimate we are seeking;

$\underline{d}$ is the difference vector;

$\underline{C}$ is the cost function;

Note that u, $\underline{d}$, $\underline{C}$ and k are complex values.

The H matrix comprises the known training symbols, as transmitted over the channel, which when multiplied with the channel estimate yields sample estimates of the training sequence. The H matrix is constructed by creating a matrix having (T−L+1) rows and L columns and filling it with the known training samples as shown below, where T is the number of symbols in the training sequence and t represents the training symbols.

$$\begin{bmatrix} t_{L-1} & \cdots & t_2 & t_1 & t_0 \\ t_L & \cdots & t_3 & t_2 & t_1 \\ t_{L+1} & \cdots & t_4 & t_3 & t_2 \\ \vdots & \cdots & \vdots & \vdots & \vdots \\ t_{T-1} & \cdots & t_{T-L+2} & t_{T-L+1} & t_{T-L} \end{bmatrix}$$

The model of the additive impairment problem, generally referenced 140, uses closed loop feedback to determine an estimate k of the DC offset. The goal is to find the k that yields a minimum C. The model comprises subtractors 142, 148 and multipliers 143, 144, 146 configured in a negative feedback loop wherein the DC offset compensation block functions to calculate the estimate k. Note that it is assumed that a known training sequence is used in determining the estimate. The training sequence is commonly sent as a preamble or midamble in the messages of many different communications schemes.

In the model, the estimated DC offset k is subtracted from the received training sequence samples. The compensated training samples are multiplied by the LS matrix to generate the channel estimate. The channel estimate is then multiplied by the H matrix resulting in estimates of the training sequence samples. The training sequence sample estimates are subtracted from the compensated received samples to generate the difference vector d. This difference vector is used in determining the DC offset estimate k.

Mathematically, the difference vector is represented by the following $$\underline{d} = (\underline{u} - \underline{e}) - H \cdot LS \cdot (\underline{u} - \underline{e}) \quad (1)$$
$$= (I - H \cdot LS)\underline{u} - (I - H \cdot LS)\underline{e}$$
$$= A\underline{u} - A\underline{e}$$

where $$A = I - H \cdot LS \quad (2)$$

and $$LS = [H^H H]^{-1} \cdot H^H \quad (3)$$

and $$\underline{e} = k\underline{v}$$

The goal is to find the k that gives a minimum C. C is a cost function that is defined as $$C = \underline{d}^H \underline{d};$$
$$C = (A\underline{u} - A\underline{e})^H (A\underline{u} - A\underline{e}) \quad (4)$$

We then take the partial derivative with respect to k and set the real and imaginary parts equal to zero and solve for k as follows $$\frac{\partial C}{\partial k} = \frac{\partial C}{\partial Re\{k\}} + j \frac{\partial C}{\partial Im\{k\}} \quad (5)$$

The partial derivative of the real part is given by $$\frac{\partial C}{\partial Re\{k\}} = -\underline{u}^H A^H A \underline{v} - \underline{v}^H A^H A \underline{u} + 2Re\{k\}\underline{v}^H A^H A \underline{v} = 0 \quad (6)$$

and setting equal to zero yields $$Re\{k\} = \frac{\underline{u}^H A^H A \underline{v} + \underline{v}^H A^H A \underline{u}}{2\underline{v}^H A^H A \underline{v}} \quad (7)$$

The partial derivative of the imaginary part is given by $$\frac{\partial C}{\partial Im\{k\}} = -\underline{u}^H A^H A \underline{v} + \underline{v}^H A^H A \underline{u} + 2Im\{k\}\underline{v}^H A^H A \underline{v} = 0 \quad (8)$$

and setting equal to zero yields $$Im\{k\} = \frac{\underline{u}^H A^H A \underline{v} - \underline{v}^H A^H A \underline{u}}{2\underline{v}^H A^H A \underline{v}} \quad (9)$$

Since $A^H A$ is a Hermetian matrix (i.e. $a_{12} = conj(a_{21})$ and $$conj(\underline{v}^H A^H A \underline{u}) = \underline{u}^H A^H A \underline{v} \quad (10)$$

the DC offset estimate k can be expressed as $$k = Re\{k\} + jIm\{k\} \quad (11)$$
$$= \frac{\underline{v}^H A^H A \underline{u}}{\underline{v}^H A^H A \underline{v}}$$
$$= \frac{\underline{1}^H A^H A \underline{u}}{\underline{1}^H A^H A \underline{1}}$$
$$= \underline{p} \cdot \underline{u}$$

where the vector p is given by $$\underline{p} = \frac{\underline{1}^H A^H A}{\underline{1}^H A^H A \underline{1}} \quad (12)$$

It is noted that the vector p can be computed a priori since it is a function of the H and LS matrices. The calculation of vector p, however, is different depending on the channel length L. This is because the dimensions of the H and LS matrices are given by (T−L+1)×L and L×(T−L+1), respectively, where T is the total number of training symbols. Therefore, a plurality of p vectors can be calculated beforehand, each corresponding to a different channel length, and stored in memory. During operation, the channel length, as determined by the channel estimation block, can be used to select the appropriate p vector to use in calculating the DC offset estimate.

For example, in the case of EDGE based communications system, the channel length can range between 3 and 7. Thus, five p vectors can be calculated beforehand and stored in memory for use during operation of the receiver. The appropriate vector for each burst is selected using the channel length determined from the channel estimate.

Figure 7:
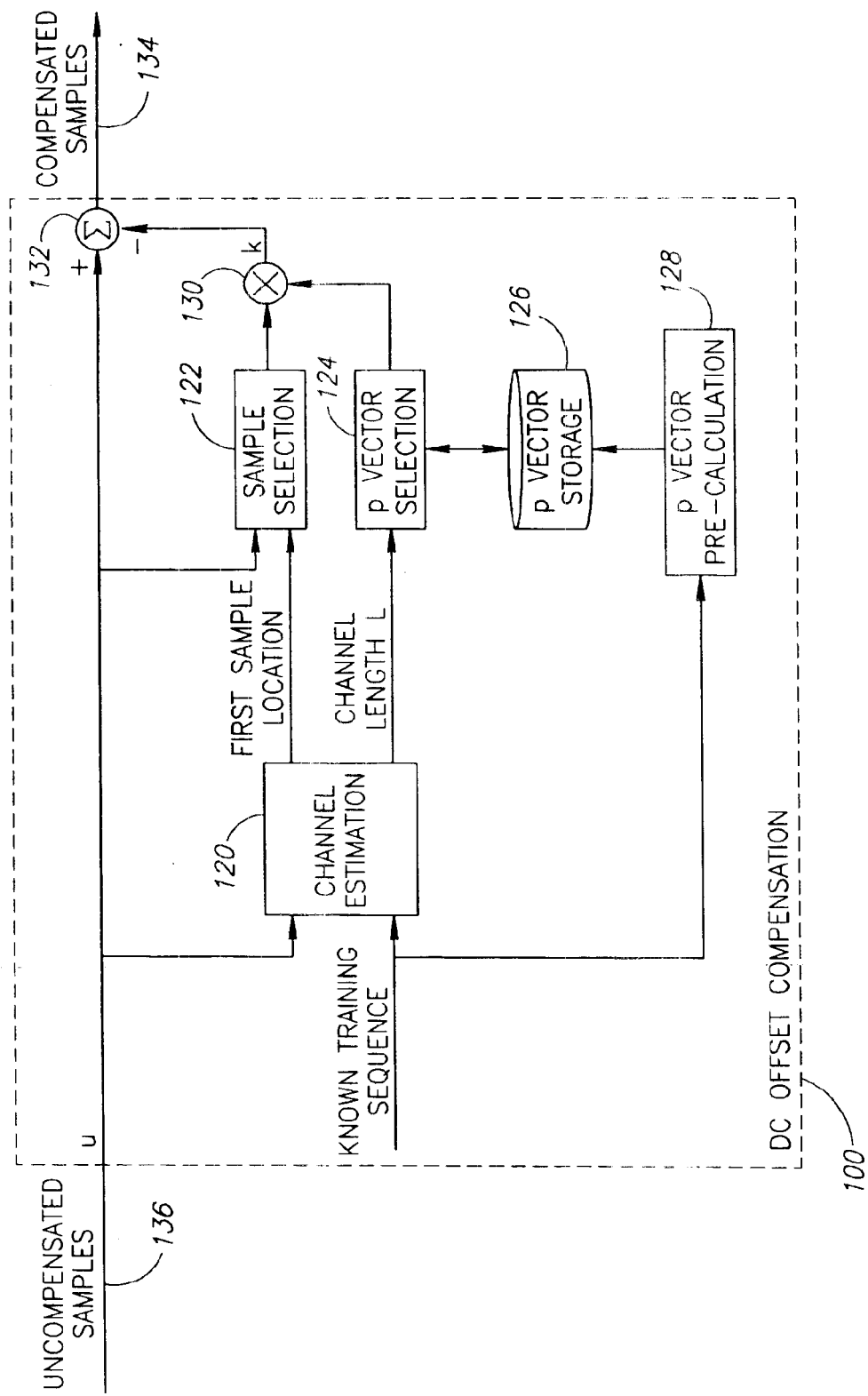
FIG. 7 is a block diagram illustrating the DC offset compensation module of the present invention in more detail.

The DC offset compensation module will now be described in more detail. A block diagram illustrating the DC offset compensation module of the present invention in more detail is shown in FIG. 7. Note that the implementation shown is one possible embodiment of the DC offset compensation module of the present invention. It is intended to operate with protocols wherein data is transmitted using messages comprising a training sequence, e.g., GSM, etc. It is appreciated that one skilled in the art can apply the principles of the present invention, in particular the expression for the DC offset estimate k, to construct other implementations of the DC offset compensation module depending on the application requirements without departing from the scope of the present invention.

The DC offset compensation module, generally referenced 100, comprises a channel estimate 120, samples selection 122, p vector selection 124, p vector memory storage 126, p vector pre-calculation module 128, multiplier 130 and adder 132. In operation, uncompensated samples u 136 from the receiver front end 98 (FIG. 4) enter the compensation module which is operative to generate an estimate k of the DC offset. The estimate k is subtracted from the uncompensated samples via adder 132 to generate compensated output samples 134.

As described hereinabove, the calculation of the DC offset requires the known training sequence and the received training sequence samples. In accordance with the invention, the vector p is optionally pre-calculated for a plurality of different channel lengths via the p vector pre-calculation unit. The resulting set of p vectors is stored in the p vector memory storage which may comprise RAM, ROM, for example, or any other suitable volatile or non-volatile type memory. The pre-calculation unit utilizes Equation 16 in calculating the p vectors. In calculating the vector, both the LS and H matrices are computed using the known training sequence symbols 138.

During the receipt of messages comprising data, one of the p vectors previously calculated is selected and used in generating the estimate of the offset. As described supra, the particular vector is chosen in accordance with the channel length L. The channel length is determined by the channel estimate block which generates an estimate of the channel using the uncompensated input samples 136 and the known training sequence symbols 138. The channel estimate is generated using of the known techniques described supra.

The output of the estimation block comprises the location 131 of the sample within the buffer of input samples corresponding to the first training sequence sample to be used in generating the offset estimate. The estimation block also outputs the channel length 133. The sample selection block 122 functions to extract the appropriate number of received training sequence samples from the input sample stream u. The appropriate number of training sequence samples are extracted using the channel length. In the case of EDGE, for example, the number of samples extracted is equal to (26−L+1). The channel length is also used by the p vector selection block to determine which of the pre-calculated p vectors to use in generating the offset estimate.

The received training sequence samples and the p vector are then multiplied in accordance with Equation 16 to generate the offset estimate k. The DC offset estimate k is then subtracted from each input sample to generate compensated output samples. The compensated output samples are subsequently input to the equalizer 102 (FIG. 4).

GSM EDGE Embodiment

Figure 8:
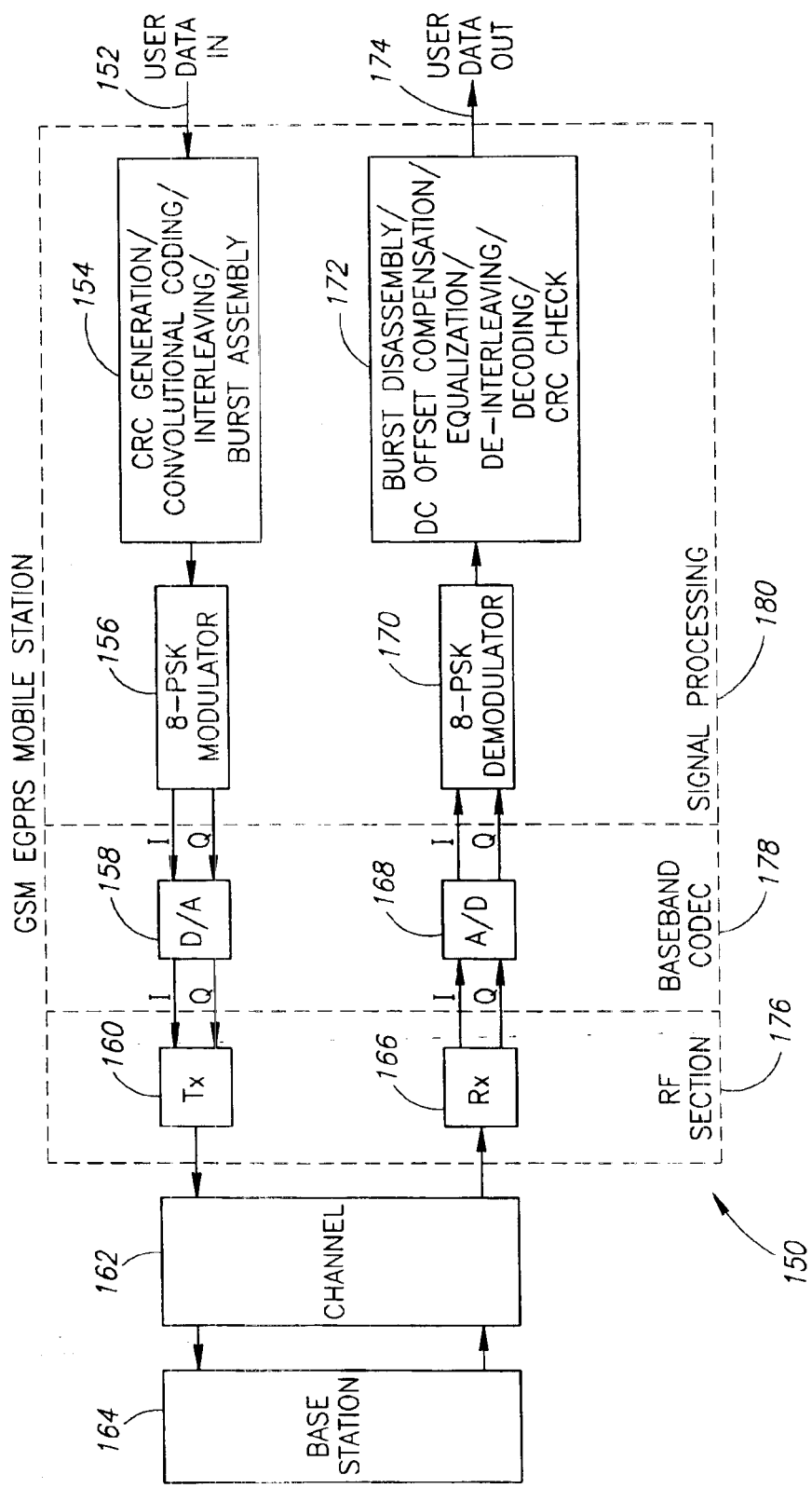
FIG. 8 is a block diagram illustrating the functional processing blocks in a GSM EGPRS mobile station.

A GSM Enhanced General Packet Radio System (EGPRS) mobile station constructed to perform the DC offset compensation method of the present invention is presented. A block diagram illustrating the functional processing blocks in a GSM EGPRS mobile radio station is shown in FIG. 8. The EGPRS system is a Time Division Multiple Access (TDMA) system wherein eight users are able to share the same carrier frequency.

The GSM EGPRS mobile station, generally referenced 150, comprises a transmitter and receiver divided into the following sections: signal processing circuitry 180, baseband codec 178 and RF circuitry section 176.

Figure 9:
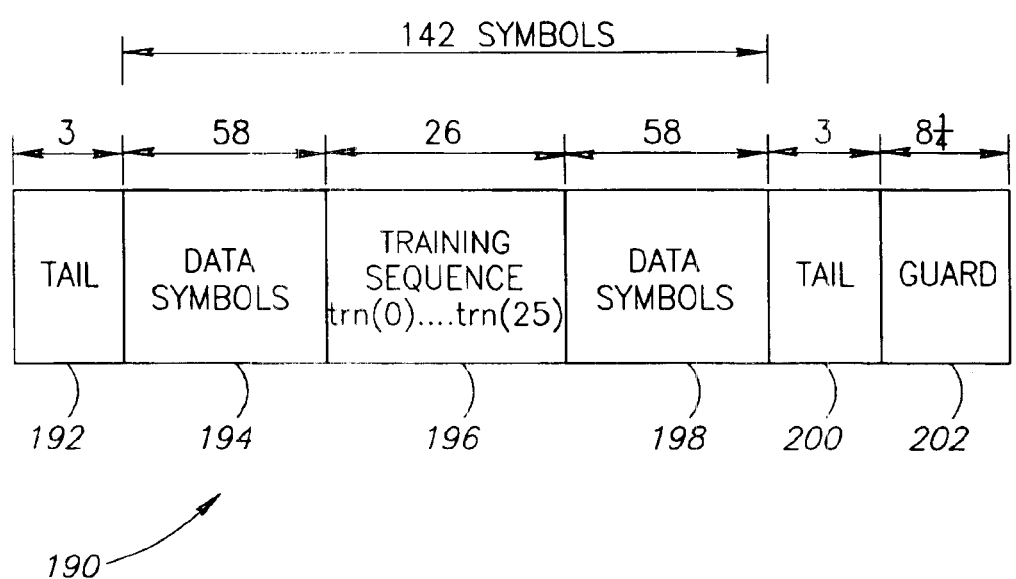
FIG. 9 is a diagram illustrating the elements of a GSM message including tail, data and training symbols.

In the transmit direction, the signal processing portion functions to protect the data so as to provide reliable communications from the transmitter to the base station 164 over the channel 162. Several processes performed by the channel coding block 154 are used to protect the user data 152 including cyclic redundancy code (CRC) check, convolutional coding, interleaving and burst assembly. An EGPRS radio station is designed to provide reliable data communications at rates of up to 480 kbit/s. In the transmitter, the data bits are encoded with a rate 1/3 convolutional encoder, interleaved and mapped to 8-ary symbols. The resultant data is assembled into bursts of 142 symbols as shown in FIG. 9. Head and tail (i.e. guard) symbols are added in addition to a training sequence midamble that is added to the middle of the burst. Note that both the user data and the signaling information go through similar processing. The assembled burst is then differentially encoded and modulated in accordance with the GSM standard by a modulator 156 which may be implemented as a $3\pi/8$ offset 8-PSK modulator or $\pi/2$ offset GMSK modulator.

In GSM, the training sequence is sent in the middle of each burst. Each fixed length burst 190 consists of 142 symbols preceded by a 3 symbol tail 192 and followed by a 3 symbol tail 200 and 8.25 symbol guard 202. The 142 symbols include a 58 symbol left data portion 194, 26 symbol training sequence 196 and another 58 symbol right data portion 198. Since the training sequence is sent in the middle of the burst, it is referred to as a midamble. It is inserted in the middle of the burst in order to minimize the maximum distance to a data bit thus minimizing the time varying effects at the beginning and end of the burst.

In the receive direction, the output of the baseband codec is demodulated using a complementary demodulator 170. Several processes performed by the channel decoding block 172 in the signal processing section are then applied to the demodulated output. The processes performed include burst disassembly, DC offset compensation in accordance with the present invention, equalization, de-interleaving, convolutional decoding and CRC check. Depending on the implementation, soft symbol generation and soft symbol to soft bit conversion may also be performed.

The baseband codec converts the transmit and receive data into analog and digital signals, respectively, via D/A converter 158 and A/D converter 168. The transmit D/A converter provides analog baseband I and Q signals to the transmitter 160 in the RF circuitry section. The I and Q signals are used to modulate the carrier for transmission over the channel.

In the receive direction, the signal transmitted by the base station over the channel is received by the receiver circuitry 166. The analog signals I and Q output from the receiver are converted back into a digital data stream via the A/D converter. This I and Q digital data stream is filtered and demodulated by the demodulator before being input to the channel decoding block 172. Several processes performed by signal processing block 172 are then applied to the demodulated output as described supra.

In addition, the mobile station performs other functions that may be considered higher level such as synchronization, frequency and time acquisition and tracking, monitoring, measurements of received signal strength and control of the radio. Other functions include handling the user interface, signaling between the mobile station and the network, the SIM interface, etc.

Simulation Results

To illustrate the benefits of the method of the present invention, a GSM Enhanced General Packet Radio System (EGPRS) was simulated and the results are presented herein. The simulation was performed assuming a GSM EGPRS transmitter and Typical Urban channel for a mobile unit moving at velocity of 50 km/h (TU50), with ideal frequency hopping employed.

The EGPRS system is a Time Division Multiple Access (TDMA) system wherein eight users are able to share the same carrier frequency. In an EGPRS transmitter, the data bits are encoded with a rate 1/3 punctured convolutional encoder, interleaved and mapped to 8-ary symbols. The resultant coded data symbols together with the training sequence are assembled into a burst of 142 symbols as shown in FIG. 9.

The burst is then modulated using $3\pi/8$-offset 8-PSK with Gaussian pulse shaping in accordance with the EDGE standard. The modulated output is transmitted over a frequency selective Gaussian channel. The receiver implements the linear (i.e. DC offset) compensation mechanism of the present invention.

Figure 10:
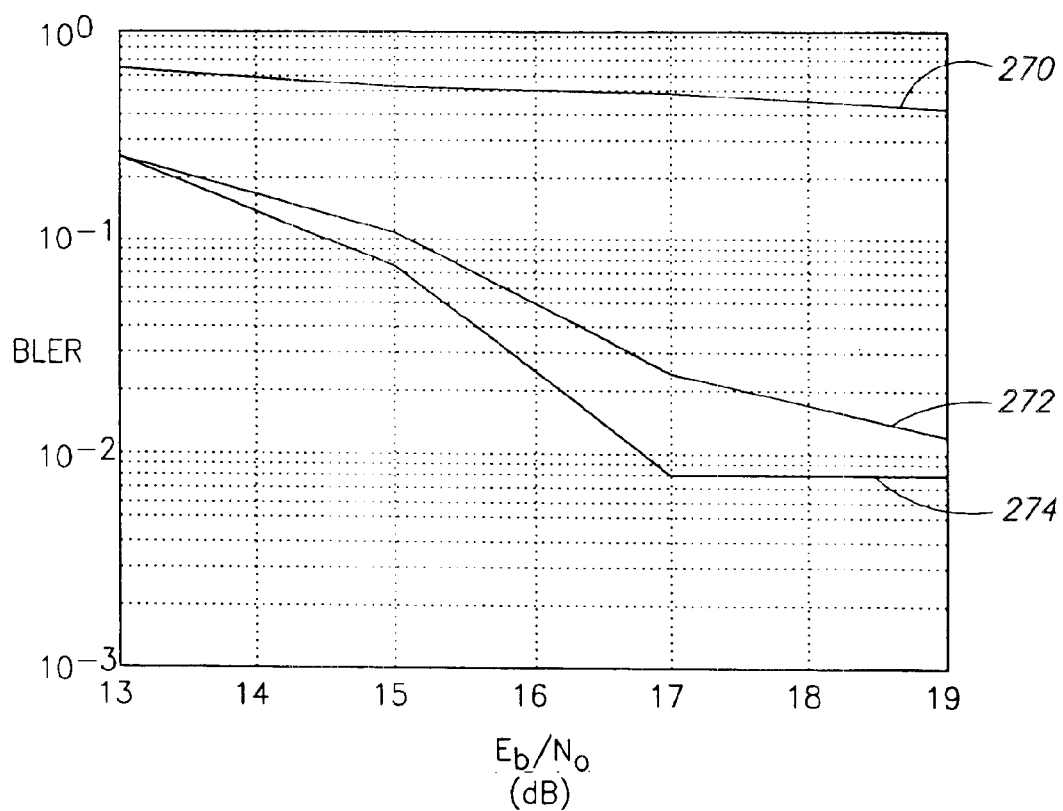
FIG. 10 is a graph illustrating simulation results showing BLER versus SNR for a concatenated communications receiver constructed with and without the DC offset compensation method of the present invention.

A graph illustrating simulation results showing block error rate (BLER) versus SNR for a concatenated communications receiver constructed with and without the DC offset compensation mechanism of the present invention is shown in FIG. 10. Curve 270 represents the case of DC offset impairments without any detection and compensation. Curve 272 represents the case of DC offset impairments with the detection and compensation mechanism of the present invention. Curve 274 represents the ideal performance which can serve as a reference to the other two curves.

It can be seen that the method of the present invention is very effective in compensating for linear impairments, achieving near ideal results for moderate levels of SNR. Thus in accordance with the invention, the DC offset compensation mechansim is effective to significantly reduce the BLER in the face of linear impairments to achieve better performance of the receiver.

Computer Embodiment

Figure 11:
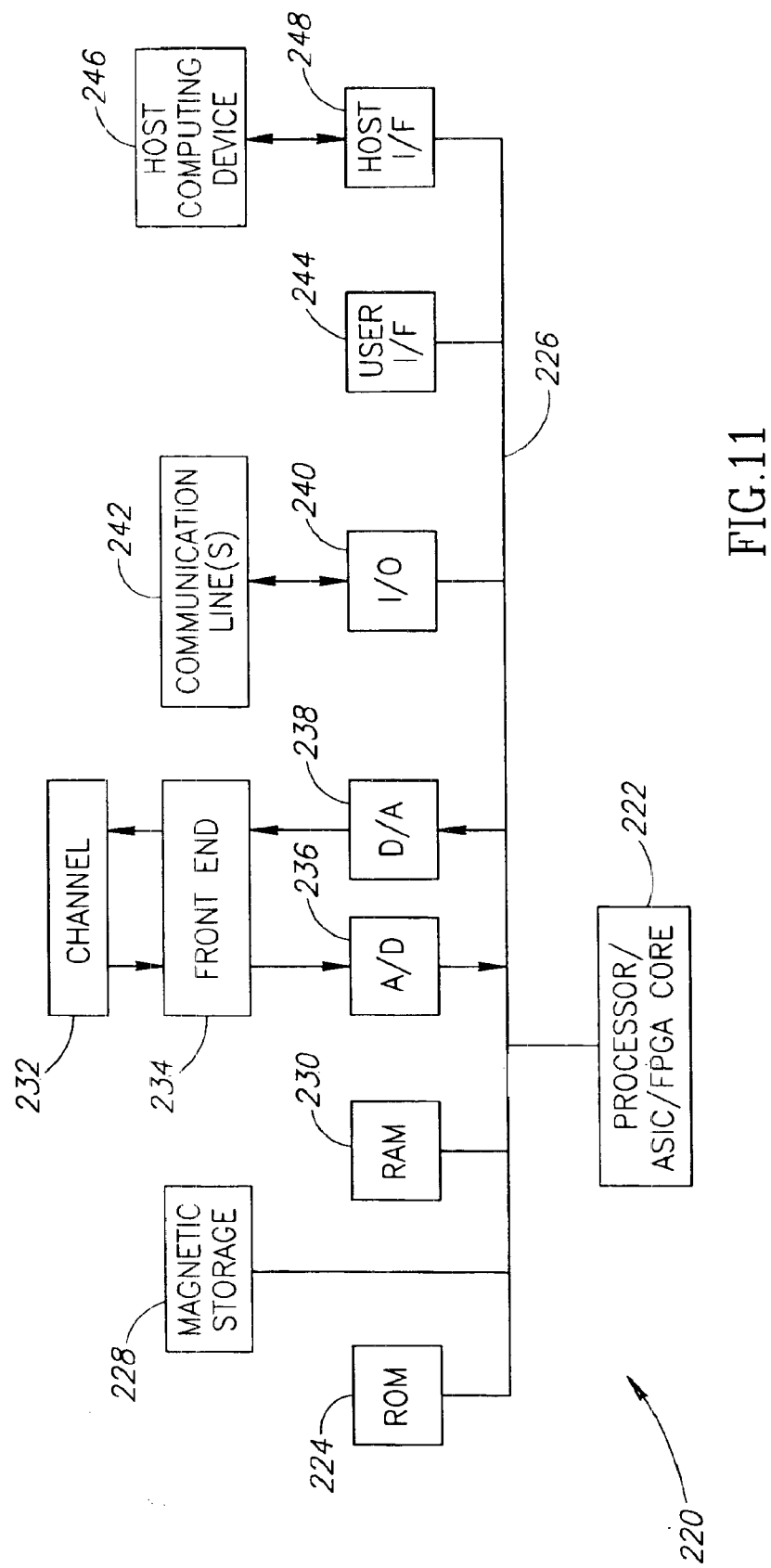
FIG. 11 is a block diagram illustrating an example computer processing system adapted to perform the DC offset compensation method of the present invention.

In another embodiment, a computer is operative to execute software adapted to perform the DC offset compensation method of the present invention. A block diagram illustrating an example computer processing system adapted to perform the DC offset compensation method of the present invention is shown in FIG. 11. The system may be incorporated within a communications device such as a receiver or transceiver, part of which is implemented in software.

The computer system, generally referenced 220, comprises a processor 222 which may be implemented as a microcontroller, microprocessor, microcomputer, ASIC core, central processing unit (CPU) or digital signal processor (DSP). The system further comprises static read only memory (ROM) 224 and dynamic main memory (RAM) 230 all in communication with the processor. The processor is also in communication, via bus 226, with a number of peripheral devices that are also included in the computer system. An A/D converter 236 functions to sample the baseband signal output of the front end circuit 234 coupled to the channel 232. Samples generated by the processor are input to the front end circuit via D/A converter 238. The front end circuit comprises RF circuitry, including receiver, transmitter and channel coupling circuitry.

One or more communication lines 242 are optionally connected to the system via I/O interface 240. A user interface 244 responds to user inputs and provides feedback and other status information. An optical host interface 248 connects a host computing device 246 to the system. The host is adapted to configure, control and maintain the operation of the system. The system may also comprise magnetic storage device 228 for storing application programs and data. The system comprises computer readable storage medium which may include any suitable memory means including but not limited to magnetic storage, optical storage, semiconductor volatile or non-volatile memory, biological memory devices, or any other memory storage device.

The reduced information packet method software is adapted to reside on a computer readable medium, such as a magnetic disk within a disk drive unit. Alternatively, the computer readable medium may comprise a floppy disk, Flash memory card, EEROM, EPROM or EEPROM based memory, bubble memory storage, ROM storage, etc. The software adapted to perform the DC offset compensation method of the present invention may also reside, in whole or in part, in the static or dynamic main memories or in firmware within the processor of the computer system (i.e. within microcontroller, microprocessor, microcomputer, DSP, etc. internal memory).

In alternative embodiments, the method of the present invention may be applicable to implementations of the invention in integrated circuits, field programmable gate arrays (FPGAs), chip sets or application specific integrated circuits (ASICs), wireless implementations and other communication system products.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of compensating for DC offset impairment in a sequence of input samples received over a channel, said method comprising the steps of:

calculating a DC offset impairment estimate $k = \underline{p} \cdot \underline{u}$ wherein p is a vector defined as $$\underline{p} = \frac{\underline{1}^H A^H A}{\underline{1}^H A^H A \underline{1}},$$

u is a vector representing uncompensated training sequence input samples, A is a vector defined as A=I–H·LS, I is the Identity matrix, H is a convolution matrix, LS is a Least Square matrix used to derive an estimate of the channel, k is the DC offset estimate; and subtracting said DC offset impairment estimate from each input sample so as to generate a sequence of compensated input samples.

2. The method according to claim 1, wherein said convolution matrix H comprises a convolution matrix derived from a known sequence of training symbols, as transmitted over the channel.

3. The method according to claim 1, wherein said Least Square matrix LS is determined from a known sequence of training symbols, as transmitted over the channel, using the following equation $$LS=[H^H H]^{-1} \cdot H^H$$

derived using Least Squares Regression techniques.

4. The method according to claim 1, wherein a plurality of p vectors, are pre-calculated, each p vector corresponding to a different channel length.

5. The method according to claim 1, wherein five p vectors are pre-calculated for channel lengths of 3, 4, 5, 6 and 7.

6. The method according to claim 1, further comprising the steps of:
pre-calculating a plurality of p vectors, each p vector corresponding to a different channel length;
calculating a channel estimate including a channel length; and
selecting one of said plurality of p vectors in accordance with said channel length.

7. The method according to claim 1, wherein said u vector is determined by the steps of:
calculating a channel estimate including a channel length and location of a first training sequence input sample within an input buffer of samples; and
selecting a number of training sequence input samples from said input buffer in accordance with said channel length.

8. The method according to claim 7, wherein the number of training sequence input samples retrieved from said input buffer comprises (T−L+1) wherein T is the number of training symbols and L is the channel length.

9. The method according to claim 1, further comprising the step of compensating for nonlinear impairments after any DC offset impairment compensation.

10. The method according to claim 1, wherein DC offset impairment compensation is performed before any nonlinear impairment compensation.

11. A method of compensating for a DC offset in a sequence of input samples received over a channel, said method comprising the steps of:
calculating an estimate of said channel and determining a channel length therefrom;
pre-calculating a vector p given by $$\underline{p} = \frac{\underline{1}^H A^H A}{\underline{1}^H A^H A \underline{1}},$$

wherein A is a vector defined as A=I−H·LS, I is the Identity matrix, H is a convolution matrix, LS is a Least Square matrix used to derive an estimate of the channel;
selecting a number of uncompensated training sequence input samples u in accordance with said channel length;
calculating an estimate of the DC offset k=$\underline{p}$·$\underline{u}$, wherein vector u represents said uncompensated training sequence input samples and k is the DC offset; and
subtracting said DC offset estimate from each input sample so as to generate a sequence of compensated input samples.

12. The method according to claim 11, wherein said convolution matrix H comprises a convolution matrix derived from a known sequence of training symbols, as transmitted over the channel.

13. The method according to claim 11, wherein said Least Square matrix LS is determined from a known sequence of training symbols using the following expression $$LS=[H^H H]^{-1} \cdot H^H$$

derived using Least Squares Regression techniques.

14. The method according to claim 11, wherein a plurality of p vectors are pre-calculated, each p vector corresponding to a different channel length.

15. The method according to claim 11, wherein five p vectors are pre-calculated for channel lengths of 3, 4, 5, 6 and 7.

16. The method according to claim 11, wherein the number of training sequence input samples selected comprises (T−L+1) wherein T is the number of training symbols and L is the channel length.

17. The method according to claim 11, further comprising the step of compensating for nonlinear impairments after any DC offset impairment compensation.

18. The method according to claim 11, wherein DC offset impairment compensation is performed before any nonlinear impairment compensation.

19. An apparatus for compensating for DC offset in a sequence of input samples received over a channel, comprising:
a channel estimation module adapted to generate an estimate of said channel including a channel length and the location of the first relevant training sequence input sample in an input sample buffer;
means for selecting a number of uncompensated training sequence input samples making up a vector u in accordance with said channel length and said location;
means for pre-calculating a vector p given by $$\underline{p} = \frac{\underline{1}^H A^H A}{\underline{1}^H A^H A \underline{1}},$$

wherein A is a vector defined as A=I−H·LS, I is the Identity matrix, H is a convolution matrix, LS is a Least Square matrix used to derive an estimate of the channel;
means for calculating an estimate of the DC offset k=$\underline{p}$·$\underline{u}$, wherein vector u represents said uncompensated training sequence input samples and k is the DC offset; and
a subtractor for subtracting said DC offset estimate from each input sample so as to generate a sequence of compensated input samples.

20. The apparatus according to claim 19, wherein said convolution matrix H comprises a convolution matrix derived from a known sequence of training symbols, as transmitted over the channel.

21. The apparatus according to claim 19, wherein said Least Square matrix LS is determined from a known sequence of training symbols using the following equation $$LS=[H^H H]^{-1} \cdot H^H$$

derived using Least Squares Regression techniques.

22. The apparatus according to claim 19, wherein a plurality of p vectors are pre-calculated, each p vector corresponding to a different channel length.

23. The apparatus according to claim 19, wherein five p vectors are pre-calculated for channel lengths of 3, 4, 5, 6 and 7.

24. The apparatus according to claim 19, wherein the number of training sequence input samples selected comprises (T−L+1) wherein T is the number of training symbols and L is the channel length.

25. The apparatus according to claim 19, wherein said means for pre-calculating said vector p comprises memory storage adapted to store the vector p.

26. The apparatus according to claim 19, wherein said means for pre-calculating said vector p comprises means for pre-calculating a plurality of p vectors and wherein one of said plurality of p vectors is selected in accordance with said channel length.

27. The apparatus according to claim 19, further comprising means for compensating for nonlinear impairments after DC offset impairment compensation.

28. A communications receiver for receiving and decoding an M-ary transmitted signal received over a channel, comprising:

a radio frequency (RF) front end circuit for receiving and converting said M-ary transmitted signal to a plurality of baseband input samples;

a DC offset compensation module comprising processing means programmed to:

calculate a DC offset estimate k=p·u wherein p is a vector defined as $$\underline{p} = \frac{1^H A^H A}{1^H A^H A \underline{1}},$$

u is a vector representing uncompensated training sequence input samples, A is a vector defined as A=I−H·LS, I is the Identity matrix, H is a convolution matrix, LS is a Least Square matrix used to derive an estimate of the channel, k is the DC offset estimate;

subtracting said DC offset estimate from each baseband input sample so as to generate a compensated baseband input samples;

a demodulator adapted to receive said compensated baseband input samples and to generate a received signal therefrom in accordance with the M-ary modulation scheme used to generate said transmitted signal;

a first decoder operative to receive said received signal and to generate a sequence of soft bit decisions therefrom;

a second decoder adapted to receive said soft bit decisions and to generate binary received data therefrom; and wherein M is a positive integer.

29. The receiver according to claim 28, wherein said communications receiver is adapted to receive and decode a Global System for Mobile Communication (GSM) Enhanced Data rates for GSM and TDMA/136 Evolution (EDGE) signal.

30. The receiver according to claim 28, wherein said second decoder comprises a convolutional decoder based on the Viterbi Algorithm (VA).

31. The receiver according to claim 28, wherein said M-ary symbol comprises an 8-PSK symbol.

32. The receiver according to claim 28, wherein said first decoder comprises a maximum likelihood sequence estimation (MLSE) equalizer.

33. The receiver according to claim 28, wherein said first decoder comprises a maximum a posterior (MAP) algorithm based equalizer.

34. The receiver according to claim 28, further comprising a de-interleaver adapted to receive said soft bit decisions and to output de-interleaved data to said second decoder for decoding into binary data therefrom.

35. The receiver according to claim 28, wherein said convolution matrix H comprises a convolution matrix derived from a known sequence of training symbols, as transmitted over the channel.

36. The receiver according to claim 28, wherein said Least Square matrix LS is determined from a known sequence of training symbols, as transmitted over the channel, using the following expression $$LS = [H^H H]^{-1} \cdot H^H$$

derived using Least Squares Regression techniques.

37. The receiver according to claim 28, wherein a plurality of p vectors are pre-calculated, each p vector corresponding to a different channel length.

38. The receiver according to claim 28, wherein five p vectors are pre-calculated for channel lengths of 3, 4, 5, 6 and 7.

39. The receiver according to claim 28, further comprising:

means for pre-calculating a plurality of p vectors, each p vector corresponding to a different channel length;

means for calculating a channel estimate including a channel length; and means for selecting one of said plurality of p vectors in accordance with said channel length.

40. The receiver according to claim 28, wherein said processing means comprises means for calculating said u vector comprising:

means for calculating a channel estimate including a channel length and location of a first training sequence input sample within an input buffer of samples; and means for selecting a number of training sequence input samples, as transmitted over the channel, from said input buffer in accordance with said channel length.

41. The receiver according to claim 40, wherein the number of training sequence input samples retrieved from said input buffer comprises (T−L+1) wherein T is the number of training symbols and L is the channel length.

42. An electronic data storage media storing a computer program adapted to program a computer to implement the functionality of the DC offset compensation module of claim 28.

43. A computer readable storage medium having a computer program embodied thereon for causing a suitably programmed system to compensate for a DC offset in a sequence of input samples received over a channel by performing the following steps when such program is executed on said system:

calculating an estimate of said channel and determining a channel length therefrom;

pre-calculating a vector p given by $$\underline{p} = \frac{1^H A^H A}{1^H A^H A \underline{1}},$$

wherein A is a vector defined as A=I−H·LS, I is the Identity matrix, H is a convolution matrix, LS is a Least Square matrix used to derive an estimate of the channel;

selecting a number of uncompensated training sequence input samples u in accordance with said channel length;

calculating an estimate of the DC offset k=p·u, wherein vector u represents said uncompensated training sequence input samples and k is the DC offset; and subtracting said DC offset estimate from each input sample so as to generate a sequence of compensated input samples.

44. The computer readable storage medium according to claim 43, wherein said steps are performed in a communications receiver adapted to receive and decode a global system for mobile communication (GSM) Enhanced Data rates for GSM and TDMA/136 Evolution (EDGE) signal.

45. The computer readable storage medium according to claim 43, wherein said input samples comprise 8-PSK symbols.

46. The computer readable storage medium according to claim 43, wherein said H matrix comprises a convolution matrix derived from a known sequence of training symbols, as transmitted over the channel.

47. The computer readable storage medium according to claim 43, wherein said LS matrix is determined from a known sequence of training symbols, as transmitted over the channel, using the following equation $$LS = [H^H H]^{-1} \cdot H^H$$

derived using Least Squares Regression techniques.

48. The computer readable storage medium according to claim 43, wherein a plurality of p vectors are pre-calculated, each p vector corresponding to a different channel length.

49. The computer readable storage medium according to claim 43, wherein five p vectors are pre-calculated lengths of 3, 4, 5, 6 and 7.

50. The computer readable storage medium according to claim 43, wherein the number of training sequence input samples selected comprises (T−L+1) wherein T is the number of training symbols and L is the channel length.

51. The computer readable storage medium according to claim 43, wherein said means for pre-calculated said vector p comprises memory storage adapted to store the matrix p.

52. The computer readable storage medium according to claim 43, wherein said means for pre-calculated said vector p comprises means for pre-calculating a plurality of p vectors and wherein one of said p vectors is selected in accordance with said channel length.

* * * * *